United States Patent
Gillingham

(10) Patent No.: US 8,400,781 B2
(45) Date of Patent: Mar. 19, 2013

(54) USING INTERRUPTED THROUGH-SILICON-VIAS IN INTEGRATED CIRCUITS ADAPTED FOR STACKING

(75) Inventor: Peter B. Gillingham, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 370 days.

(21) Appl. No.: 12/757,540

(22) Filed: Apr. 9, 2010

(65) Prior Publication Data

US 2011/0050320 A1    Mar. 3, 2011

Related U.S. Application Data

(60) Provisional application No. 61/239,211, filed on Sep. 2, 2009.

(51) Int. Cl.
*H05K 1/11* (2006.01)
(52) U.S. Cl. ........ 361/790; 361/302; 361/313; 361/735; 216/18; 257/686; 257/723; 257/774; 607/37
(58) Field of Classification Search .................. 361/790, 361/302, 313, 735; 216/18; 257/686, 723, 257/774; 607/37
See application file for complete search history.

(56) References Cited

U.S. PATENT DOCUMENTS

| | | | | |
|---|---|---|---|---|
| 5,162,260 A | * | 11/1992 | Leibovitz et al. | 216/18 |
| 5,184,095 A | * | 2/1993 | Hanz et al. | 333/33 |
| 5,585,675 A | * | 12/1996 | Knopf | 257/774 |
| 5,852,397 A | * | 12/1998 | Chan et al. | 338/22 R |
| 7,164,572 B1 | * | 1/2007 | Burdon et al. | 361/302 |
| 2006/0186906 A1 | * | 8/2006 | Bottoms et al. | 324/754 |
| 2007/0060970 A1 | * | 3/2007 | Burdon et al. | 607/37 |
| 2008/0304242 A1 | * | 12/2008 | Baek et al. | 361/735 |
| 2009/0085217 A1 | | 4/2009 | Knickerbocker et al. | |
| 2009/0127668 A1 | | 5/2009 | Choi | |
| 2010/0025682 A1 | * | 2/2010 | Lee et al. | 257/48 |
| 2010/0121994 A1 | | 5/2010 | Kim et al. | |

FOREIGN PATENT DOCUMENTS

WO    2009140244    11/2009

OTHER PUBLICATIONS

8 Gb 3-D DDR3 DRAM Using Through-Silicon-Via Technology.

* cited by examiner

*Primary Examiner* — Xiaoliang Chen
(74) *Attorney, Agent, or Firm* — Harvey Auerback

(57) ABSTRACT

In an integrated circuit (IC) adapted for use in a stack of interconnected ICs, interrupted through-silicon-vias (TSVs) are provided in addition to uninterrupted TSVs. The interrupted TSVs provide signal paths other than common parallel paths between the ICs of the stack. This permits IC identification schemes and other functionalities to be implemented using TSVs, without requiring angular rotation of alternate ICs of the stack.

18 Claims, 6 Drawing Sheets

• DQ • DQ • DQ • DQ •DQS •DQS*• DQ • DQ • DQ • DQ

• DQ • DQ • DQ • DQ •DQS •DQS*• DQ • DQ • DQ • DQ

• Vss • Vdd • Vss • Vdd • Vss • Vdd • Vss • Vdd • Vss • Vdd

•RCA •RCA •RCA •RCA •RCA • RA  • RA  • RA  • RA  • BA

• DIb • R*  • CAS •CLK*• SDo • SIo • CLK • RAS • WE  • DId
                              ╳ center
• DIa • WE  • RAS • CLK • SIi • SDi •CLK*• CAS • R*  • DIc

• BA  • RA  • RA  • RA  • RA  •RCA •RCA •RCA •RCA •RCA

• Vdd • Vss • Vdd • Vss • Vdd • Vss • Vdd • Vss • Vdd • Vss

• DQ • DQ • DQ • DQ •DQS*•DQS• DQ • DQ • DQ • DQ

• DQ • DQ • DQ • DQ •DQS*•DQS• DQ • DQ • DQ • DQ

FIG. 13

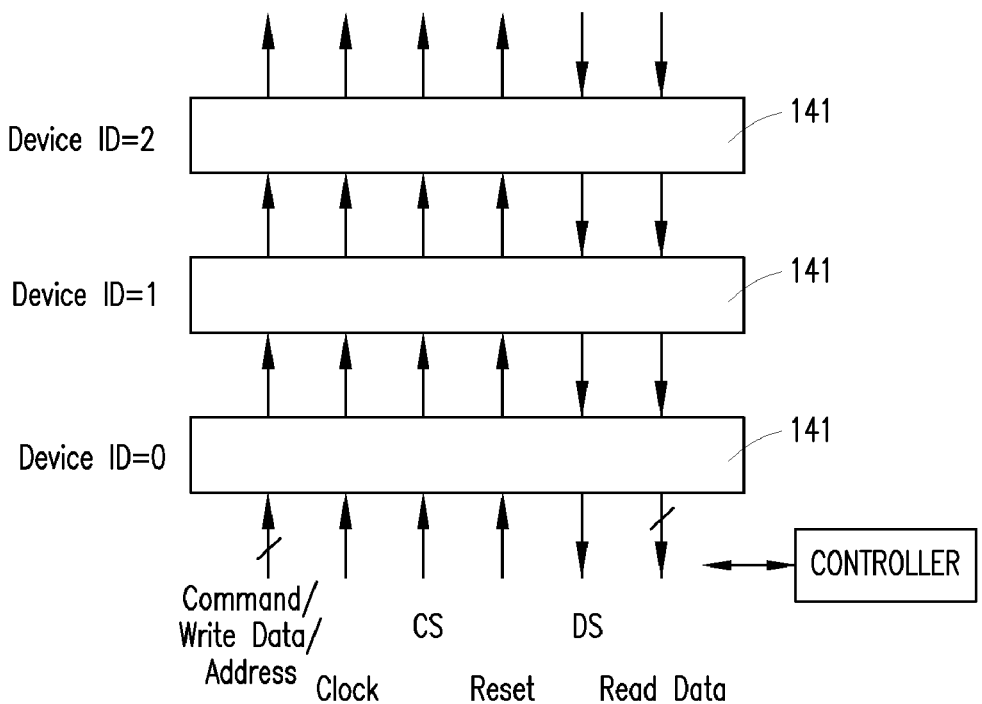

FIG. 14

USING INTERRUPTED THROUGH-SILICON-VIAS IN INTEGRATED CIRCUITS ADAPTED FOR STACKING

This application claims priority under 35 USC 119 to U.S. Provisional Application No. 61/239,211 which was filed on Sep. 2, 2009 and is incorporated herein by reference.

FIELD

The present work relates generally to integrated circuits and, more particularly, to stacked arrangements of interconnected integrated circuits.

BACKGROUND

Through Silicon Via (TSV) technology is an emerging solution for connection of stacked semiconductor integrated circuit (IC) chips. Very wide busses are possible because the TSV density can be much higher than conventional pads for wire bonding. Normal bonding pads for wire bonds have planar dimensions of around 100 um while TSVs may be 10 um or even smaller. Connecting a bus between a number of stacked chips is straightforward because the connection is made vertically between each chip in a stack of chips. FIG. 1 shows the cross section of a TSV structure in a single integrated circuit die before wafer stacking. The TSV extends from the bottom of the chip through the silicon substrate and through the layers of active circuitry and interconnect. A pad is located at the top and bottom surface of the die electrically connected to the TSV. Finally, a solder ball is attached to the top pad.

A process for manufacturing TSVs is described in the paper "Through-Silicon Via (TSV)" by Makoto Motoyoshi published in the Proceedings of the IEEE vol. 97, no. 1, Jan. 2009, incorporated herein by reference. First, the semiconductor circuit is fabricated on a silicon wafer using well known processes to complete the active circuit and interconnect layers, including the top layer bonding pads. The wafer may then be polished on the back side to reduce the thickness. The top side of the wafer may be bonded to a handle wafer to provide mechanical support during subsequent polishing and TSV process steps, and to protect the active circuit and interconnect layers. Then a photoresist layer is applied to the back surface of the wafer and the areas where TSVs are to be defined. A deep silicon etch process and successive reactive ion etch (RIE) processes create through holes extending from the back of the wafer, through both the substrate and the active circuit and interconnect layer to expose the bottom of the top side bonding pads. The etch process is stopped by the metal bonding pad. Then a side wall insulator within the through holes is formed using low-temperature plasma-enhanced chemical vapor deposition (PECVD) $SiO_2$. This prevents the TSV from shorting to the substrate. A further RIE process removes the $SiO_2$ from the bottom of the top side bonding pad to allow the TSV contact. A contact metal layer and/or a diffusion barrier metal layer may be deposited in the through hole at this stage. The through hole is then filled with conductive material such as a conductive paste or through a process such as plating or metal CVD. The final step is deposition of metal on the bottom of the wafer and formation of bottom bonding pads. The handle wafer is then removed and solder balls are attached to the top bonding pads.

The chip stack is assembled by positioning one die on top of another, with respectively corresponding TSVs aligned along the TSV axes (resulting in axially aligned TSVs), and raising the temperature to melt the solder ball material. FIG. 2 shows a cross section of two stacked chips with TSV interconnection. The process may be repeated to stack more chips.

The vertical TSV interconnect shown in FIG. 2 is useful for bus interconnection where every chip is connected in the same way to the same set of TSVs. Memory chips may be connected in this way to common address, data, and control busses as shown (see page 130) in the paper "8 Gb 3D DDR3 DRAM using Through Silicon Via Technology", by Kang et. al., published in the ISSCC Digest of Technical Papers, February 2009, and incorporated herein by reference. However, a problem remains in stacking bussed memory chips that are each indistinguishable from one another. That is, the problem of uniquely identifying each chip so that commands such as read and write are only executed by a single chip in the stack. In conventional printed circuit board memory subsystems or wire-bonded multi-chip packages, typically a unique chip enable signal CE is sent to each device sharing a bus to identify which chip is being addressed and which chip has control of the databus. This approach does not work in stacked memory devices which are connected only with continuous vertical TSVs.

United States Patent Application Publication 2009/0127668, incorporated herein by reference, provides a solution to this problem. In a stack of common die with TSVs, every other die is rotated by 180° to provide a serial TSV connection that passes through intervening circuitry on each die. A disadvantage of this solution is that TSVs must be located symmetrically about the axis of rotation of the chip, which is typically the geographical center of a rectangular die. This reduces the flexibility in placement of TSVs and may lead to a die size penalty. Some memory devices such as NAND flash have pads located along one edge of the die which would preclude this approach.

United States Patent Application Publication 2009/0161402, incorporated herein by reference, discloses a similar method of making serial TSV connections through die rotation. Instead of a memory bus with common connections to all die within the stack, a serial point-to-point daisy-chained ring configuration is used. United States Patent Application Publications 2007/0233917, 2007/0234071, and 2008/0155219, all of which are incorporated herein by reference, disclose several alternatives for device ID assignment in a serial point-to-point daisy-chained ring topology. The serial point-to-point daisy-chained ring configuration has a disadvantage in that the ring cannot be completely connected using TSVs. In particular, wire bonds are required to connect the top die of the stack to the package substrate in order to pass data back to the controller.

US Patent Publication 2007/0165457, incorporated herein by reference, discloses a serial point-to-point topology with an upstream path and a downstream path passing through each memory device. The top device does not have a direct connection back to the controller, so the aforementioned bonding wires are not required. However, assuming all of the stacked memory devices are identical, the last device would have unconnected inputs to the downstream links to the controller. These unconnected inputs may pick up random noise, thus causing unnecessary logic transitions, and thus unnecessary power dissipation, on each downstream link.

It is desirable in view of the foregoing to provide for stacked arrangements of connected integrated circuits that avoid disadvantages such as described above.

BRIEF DESCRIPTION OF THE DRAWINGS

FIG. 13 diagrammatically illustrates signal assignments for interrupted and uninterrupted TSVs in an SDRAM stack that employs alternate IC rotation according to exemplary embodiments of the present work.

FIG. 14 diagrammatically illustrates serial point-to-point interfacing for load reduction in stacked TSVs of an IC stack according to exemplary embodiments of the present work.

DETAILED DESCRIPTION

Example embodiments of the present work use interrupted TSVs that provide serial connections through successive integrated circuit die in a stack without the need for die rotation. With an interrupted TSV, the connection between bottom pad and top pad is broken to allow connections other than direct (uninterrupted) vertical connections.

Figure 3:
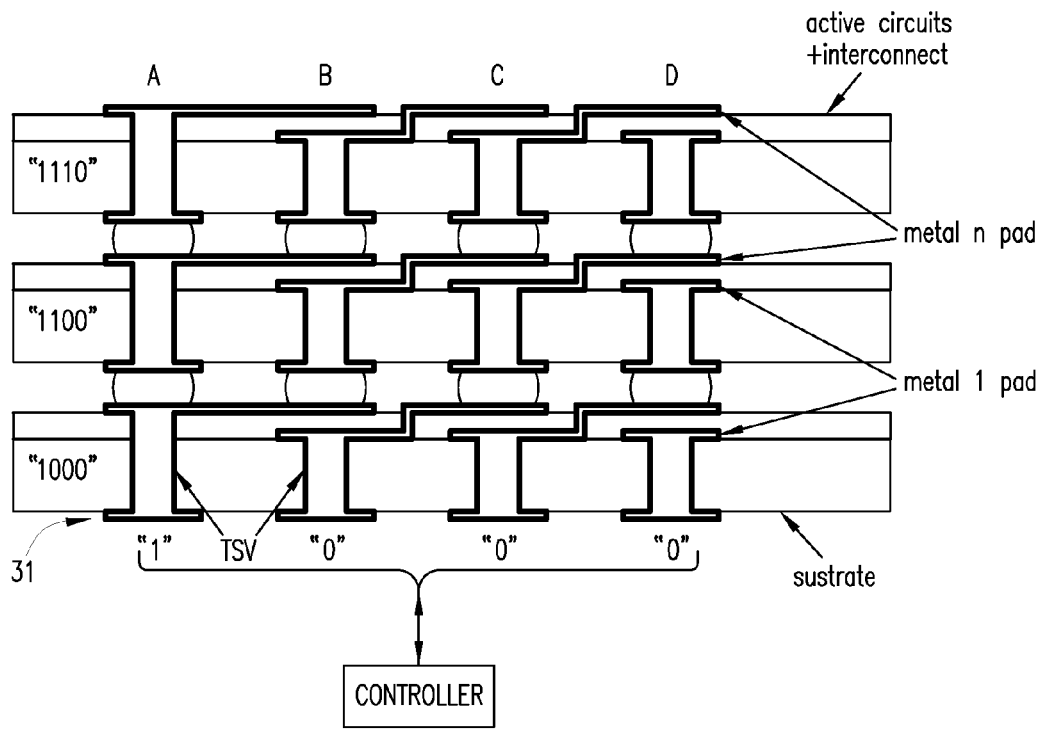
FIGS. 3 and 4 diagrammatically illustrate a stack of ICs interconnected by uninterrupted and interrupted TSVs according to exemplary embodiments of the present work.

FIG. 3 shows an example of stacked chips interconnected using interrupted TSVs according to the present work to provide connections that are not direct vertical connections. The TSVs in position A are conventional uninterrupted vertical connections between a pad on the bottom surface of the die and the top metal layer, while the TSVs in positions B, C, and D are interrupted TSVs.

Figure 1:
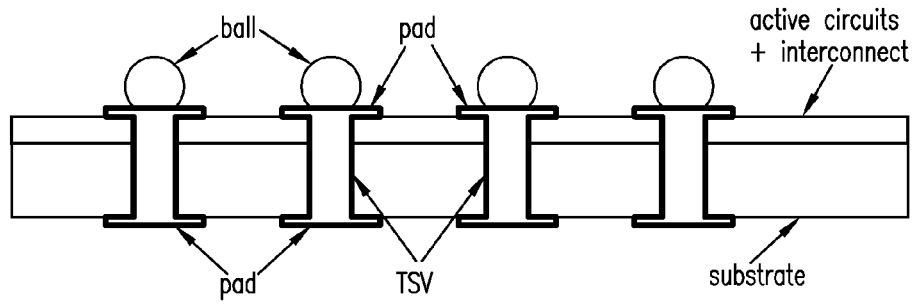
FIG. 1 diagrammatically illustrates a prior art IC with TSVs.
Figure 2:
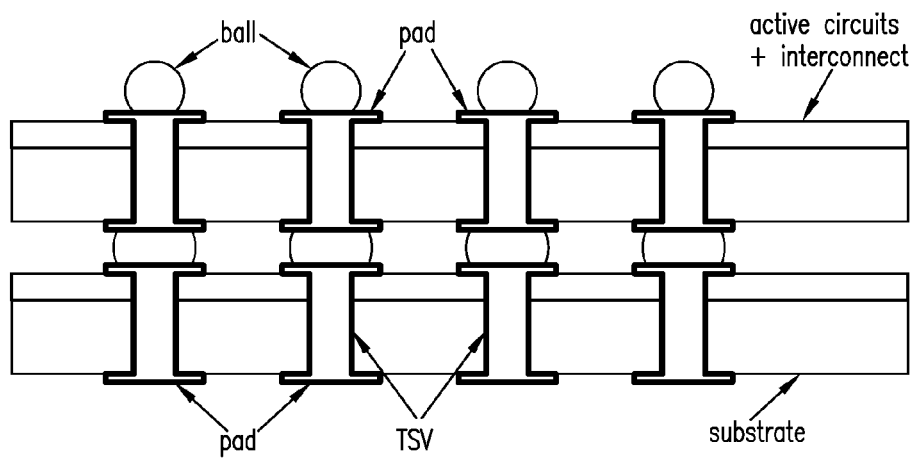
FIG. 2 diagrammatically illustrates a prior art stack of ICs interconnected by TSVs.

Within the active circuit and interconnect region of the chip there may be many conductive layers. Modern logic processes have 9 layers of metal interconnect or even more. The top metal layer is indicated here as metal n and the bottom layer as metal 1. In addition connections can be made with polysilicon or even diffusion layers. Unlike the prior art continuous TSV (see also FIGS. 1 and 2) that extends vertically from a bottom pad to a top pad, the interrupted TSV (B,C,D) extends from the bottom pad through the substrate and then terminates at metal layer 1 within the active circuit and interconnect region. The metal 1 TSV terminal can be connected to any circuitry within the active circuit and interconnect region. In various embodiments, the interrupted TSVs (B,C,D) terminate at various metal layers between layer 1 and layer n. The top metal layer n provides the connection at the top surface of the die for both uninterrupted and interrupted TSVs. With an interrupted TSV, the bottom pad 31 is separated and electrically distinct from the corresponding overlying and axially aligned top pad at metal n in FIGS. 3 and 4. For mechanical support, both the top metal connection and the lower metal connection may each comprise several metal layers, for example metal 1 combined with metal 2 for the contact to the material in the through hole, and metal n combined with metal n−1 for the top connection to the top pad (TSV output).

Figure 4:
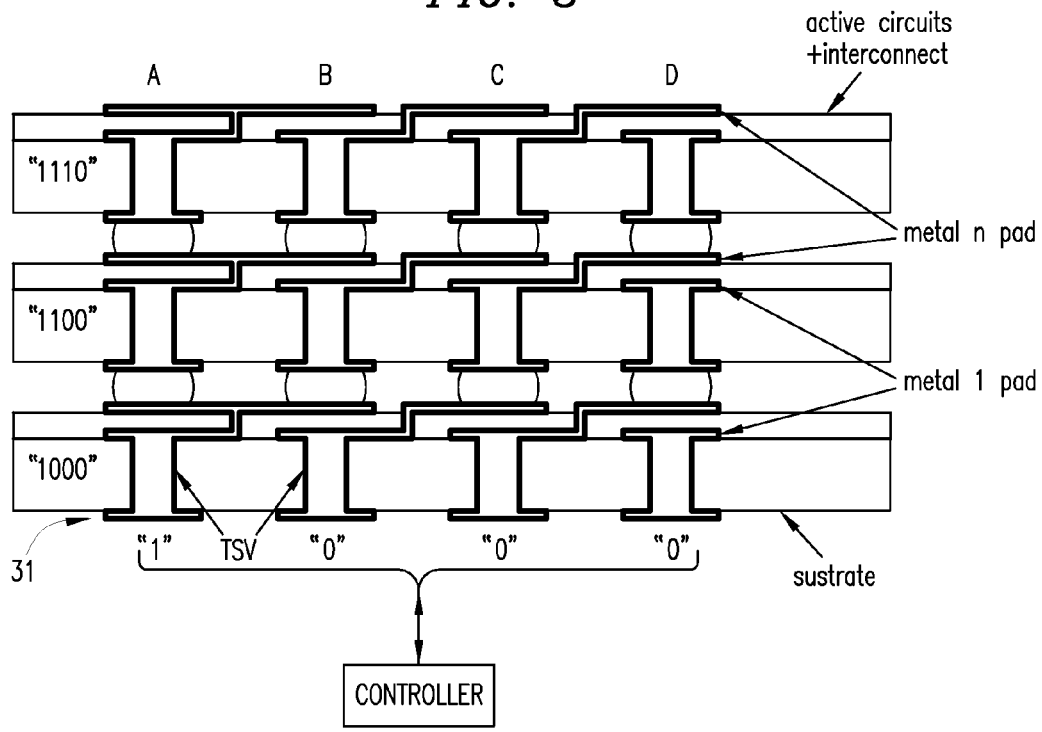

The process for etching the through holes and filling in the TSV conductive material remains essentially the same as in the prior art. In the case of the uninterrupted TSV A, the deep silicon etch process and successive reactive ion etch (RIE) processes will terminate at the top metal layer n. For the interrupted TSV (B, C, or D), the process will terminate at a lower metal layer. For enhanced uniformity of this etch process, even the uninterrupted TSV at A can be formed using the same lower metal layer as the interrupted TSVs, for example metal 1, and the connection to the top metal can be made through normal vias and metal layers within the active circuit and interconnect region, as shown in FIG. 4. This can prevent such problems as over-etching the shallower through hole to the lower metal layer in the case of an interrupted TSV and under-etching the deeper through hole to the top metal layer in the case of an uninterrupted TSV.

The interrupted TSV can be used to create serial connections between the chips in a stack of common chips, without the need for alternate chip rotation. Therefore the location of the TSVs on the constituent common chips may be arbitrary and not subject to restrictions such as symmetry about an axis of rotation.

Interrupted TSVs (B,C,D) can be combined with vertically continuous (uninterrupted) TSVs (A) as may be advantageous for a desired function. For example, in a stack of memory chips, data, address, and control busses can use uninterrupted TSVs while a chip identification bus can employ interrupted TSVs interconnected in a staggered manner such as shown in FIGS. 3 and 4. This provides capability to uniquely identify chips within a stack. The TSVs of the bottom chip are connected to logic "1" and logic "0" levels as shown. In some embodiments, logic "1" is the positive supply voltage Vdd and logic "0" is the ground supply voltage Vss. A vertical stack of interconnected, uninterrupted TSVs (defined by all of the TSVs designated at A in FIGS. 3 and 4) is connected (at the corresponding pad 31 of the bottom chip) to logic "1", while three other, interrupted TSVs B, C, and D are connected (at the corresponding pad 31 of the bottom chip) to logic "0".

Among the interrupted TSVs (B,C,D), each output pad located on the top of the chip is connected to a respective input pad located on the bottom of the chip and axially offset from the top pad. Interrupted TSVs having this axial offset feature are also referred to herein as staggered TSVs. As a result of the axially offset pairs of top and bottom pads connected by the respective staggered TSVs B, C, and D, each chip receives a different combination of bits from the four TSVs A, B, C, and D, starting with "1000" for the lowest chip, "1100" for the next chip, and "1110" for the uppermost chip shown. This type of code is sometimes referred to as a thermometer code. Other codes may be employed that change from chip to chip as a result of interconnection using staggered TSVs. The number of staggered TSVs can be increased to provide a wider range of unique chip identification codes. A benefit of the staggered TSV approach is that no intervening logic or active circuitry between TSVs is required to produce the chip ID codes. In some embodiments, the logic levels received on the TSV are encoded as binary numbers as shown in Table 1.

TABLE 1

| TSV input | Encoded Chip ID |
|---|---|
| 100000... | 000 |
| 110000... | 001 |
| 111000... | 010 |
| 111100... | 011 |
| 111110... | 100 |

In some embodiments, in addressing the stack of chips, the controller provides to every chip in the stack a number of Chip Enable (CE) signals through respective uninterrupted vertically interconnected TSVs. Each chip in the stack would only respond to the CE signal combination corresponding to its unique chip identification code, such as the thermometer code described above. In some embodiments, the controller sends an encoded chip ID address field as shown in Table 1 above with each instruction. Only the chip whose encoded chip ID (as determined on-chip using TABLE 1) matches the encoded chip ID field within the instruction responds to the instruction.

Figure 5:
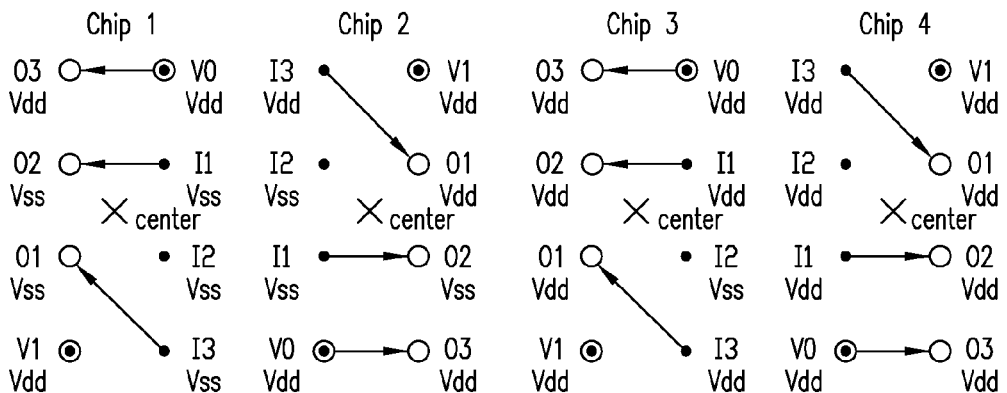
FIG. 5 diagrammatically illustrates combining on-chip interconnections among TSVs with alternate IC rotation to support IC identification in a stack of ICs according to exemplary embodiments of the present work.

Serial TSV connections can also be created using a staggered arrangement of interrupted TSVs in combination with the die rotation approach disclosed in United States Patent Application Publication 2009/0127668. FIG. 5 shows a top planar view of 4 chips to be stacked. In the diagram, a small solid circle represents a bonding pad on the bottom of the chip and a TSV. This is referred to as a TSV input (which can optionally include a bonding pad on top of the chip). A large open circle represents a bonding pad on the top of the chip and a solder ball. This is referred to as a TSV output (which can optionally include a TSV and/or a bonding pad on the bottom of the chip). Two direct vertical (i.e., uninterrupted) TSVs labeled as V0 and V1 include both top and bottom bonding pads as well as a TSV and a solder ball. These uninterrupted TSVs are shown as smaller solid circles inside larger open circles. V0 and V1 are located at positions symmetrically opposite the center of rotation of the chip. When one chip is rotated 180° and placed on top of another un-rotated chip, V0 and V1 on the bottom chip will be connected to V1 and V0 respectively on the top chip. In this example Chip 1 is on the bottom and both V0 and V1 are connected to Vdd through the package substrate.

On each die there are also 3 TSV inputs labeled I1, I2, and I3 and 3 TSV outputs labeled O1, O2, and O3. When a die is rotated and placed on top of an un-rotated die, O1, O2, and O3 on the bottom die will be connected to I1, I2, and I3 respectively on the top die. Within the die, V0 is connected to O3, I1 is connected to O2, and I3 is connected to O1, through internal connections. On the bottom die identified as Chip 1, I1, I2, and I3 are connected to Vss through the package substrate as indicated. Chip 2 is rotated 180° and placed on top of Chip 1. I3 on Chip 2 receives Vdd from O3 on the lower chip and provides this logic level to O1. I1 and I2 on Chip 2 remain at Vss. Chip 3 has the same orientation as Chip 1 and receives Vdd on both I1 and I3 while I2 remains at Vss. Chip 4 has the same orientation as Chip 2 and receives Vdd on I1, I2 and I3. In this way each chip receives a unique combination of logic levels on the three inputs I1, I2, and I3 which can be used as chip identifiers. This approach can also be extended to accommodate larger numbers of chips by increasing the number of staggered, interrupted TSVs.

Figure 6:
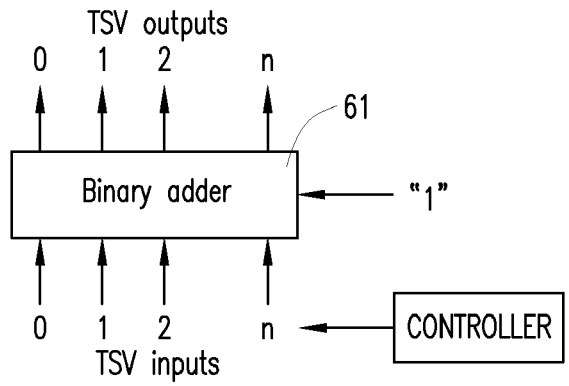
FIG. 6 diagrammatically illustrates an adder circuit combined with interrupted TSVs to support IC identification in a stack of ICs according to exemplary embodiments of the present work.

The use of staggered, interrupted TSVs to uniquely identify individual chips in a stack of chips as explained above requires one additional TSV input and output on each chip for each additional chip in the stack. For a large stack this can lead to a significant number of TSVs. A solution is to propagate encoded chip ID codes through the TSVs rather than the thermometer or similar type codes in the solution above. For this, some embodiments provide a binary adder 61 between TSV inputs at the bottom of each die and TSV outputs at the top of each die, as shown in FIG. 6.

Each chip includes a binary adder 61 which takes an n-bit binary word from the TSV inputs and adds binary "1" to provide an incremented n-bit binary word to the TSV outputs. The TSV inputs at the first chip at the bottom of the stack can be connected to Vss, for example, representing the binary number '... 0000', so the second chip will receive the binary number '... 0001', the third chip will receive '... 0010', and so on. This approach can uniquely address up to $2^n$ die within a stack. The TSV inputs at each chip in the stack provide the chip ID code (as originated by the external controller) for identifying when the particular chip is enabled/addressed, either by dedicated chip enable inputs or chip ID fields encoded within received commands. This approach can be implemented using serial TSV connections implemented with interrupted TSV or with uninterrupted TSVs and alternate die rotation.

Figure 7:
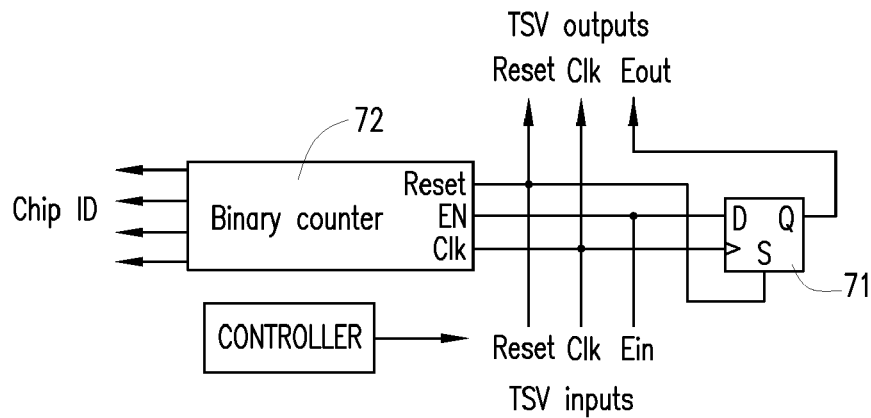
FIGS. 7 and 8 diagrammatically illustrate a counter circuit arrangement combined with interrupted and uninterrupted TSVs to support IC identification in a stack of ICs according to exemplary embodiments of the present work.
Figure 8:
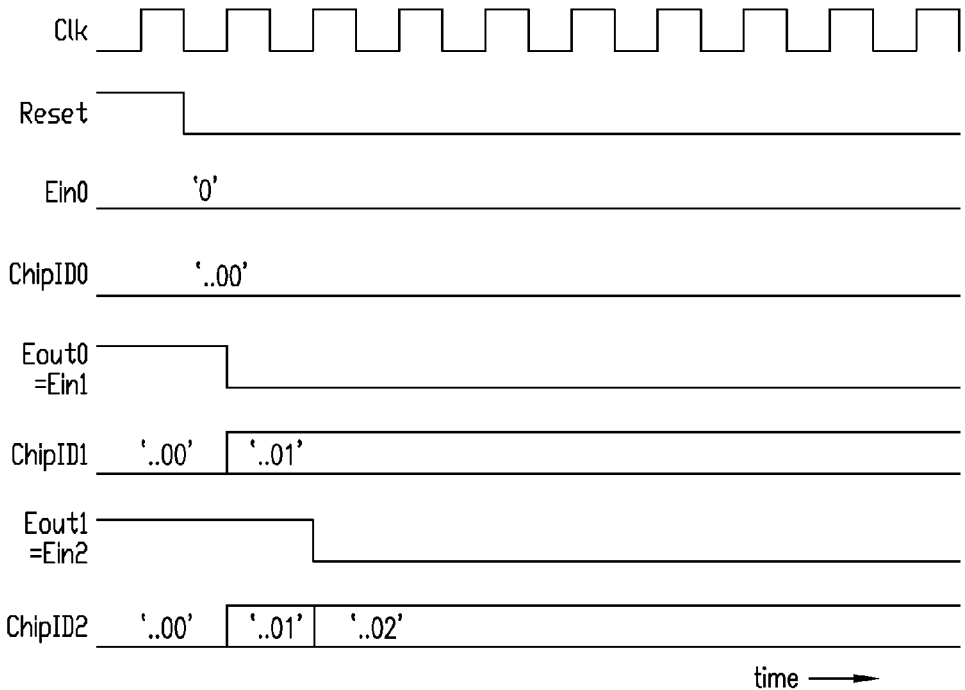

To save further on the TSV overhead needed to uniquely identify individual chips within a stack of chips, some embodiments use a serial approach as shown in the example of FIGS. 7 and 8. Three additional TSVs are provided on each chip. Two uninterrupted TSVs propagate through every chip to distribute a Reset and a clock (Clk). An enable signal is routed through a serial (interrupted) TSV in and out of a set-able D-type flip-flop 71 in each chip. The flip-flop 71 receives the TSV input Ein from the previous chip in the stack at its D input terminal and provides its Q output at the TSV output Eout for the next chip in the stack. At stack power-up, the Reset input is held high for a period of time to reset the binary counter outputs to "... 000" and to set the D-type flip-flop's output to "1". The Ein0 input at the bottom chip of the stack is held low. The Reset input is then taken from the high logic level to the low logic level.

On the first rising clock edge after the Reset input is brought low, a binary counter 72 in each chip of the stack except the first (bottom) chip will be clocked and incremented from "... 000" to "... 001". The counter 72 of the first chip will remain at the reset state "... 000" because Ein0 has a low logic level which prevents the counter from incrementing. On the same clock edge the Q output D-type flip-flop on the first chip will change from the "1" set state to "0". This Q output is provided to TSV output Eout0 that connects to the Ein1 input on the second chip in the stack. Since the second chip had a logic "1" on the En1 input during the first rising edge of the clock, the counter will have incremented from "... 000" to '... 001". After Ein1 goes low following the first rising edge of the clock, the counter on the second chip is prevented from incrementing further and will remain at "... 001". Similarly, the counter in the third chip in the stack will increment on the first two rising edges of the clock following de-assertion of the Reset input and will stop counting at "... 010". De-assertion of the enable signal Ein propagates through one more level of the chip stack on each rising edge of the clock to inhibit counting on each successive chip. In this way each chip in the stack is assigned a unique chip ID, namely, the output of its counter 72. This approach can be implemented using serial TSV connections implemented with interrupted TSV or with uninterrupted TSVs and alternate die rotation.

Figure 9:
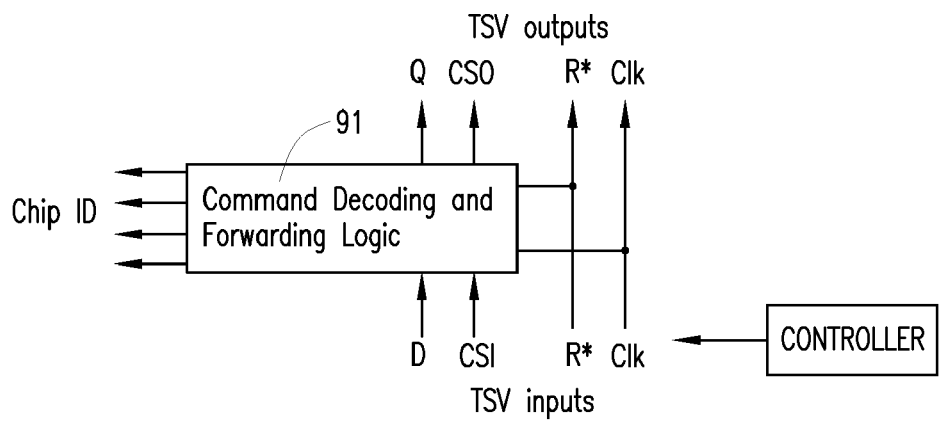
FIGS. 9 and 10 diagrammatically illustrate decoding/forwarding logic combined with interrupted and uninterrupted TSVs to support IC identification in a stack of ICs according to exemplary embodiments of the present work.
Figure 10:
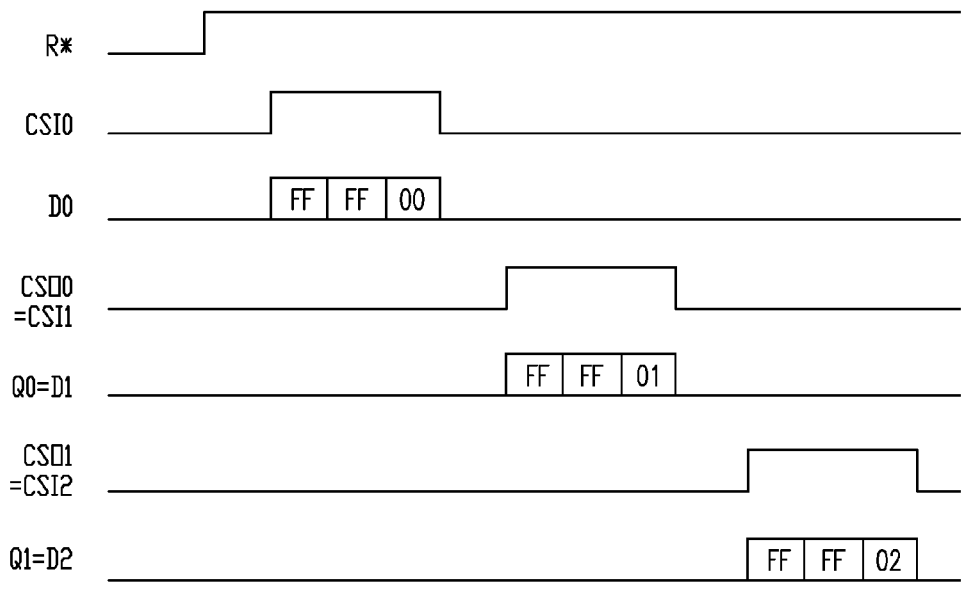

Embodiments such as shown in FIGS. 9 and 10 provide unique identifiers to chips in a stack through an initialization sequence transmitted using a serially connected protocol. In some embodiments, the protocol also supports other operations, such as background maintenance operations that are performed periodically or after initialization. In some embodiments, the protocol further supports normal functional operations of the chip, for example read and write operations of a memory chip.

In the serially connected protocol, commands are received in one device in a stack from a previous device in the stack. In some embodiments, the received commands are latched into the receiving device, and also forwarded to the next device in the stack. An example command packet is shown as Table 2.

TABLE 2

| Device ID | Command | Address | Address | Data | Data | Data | ... |
| --- | --- | --- | --- | --- | --- | --- | --- |

Each field in the command packet may be exactly one byte in length or may have a different length. Each bit may be transmitted sequentially on a 1-bit synchronous interface or each field may be transmitted on a single clock edge. Clocking may be either single data rate (SDR) using one edge of the clock signal or double data rate (DDR) using both edges of the clock. The command includes a Device ID field indicating to which device the command is addressed, a Command field indicating the type of command such as memory read or memory write, one or more optional Address fields depending on the command, and one or more optional Data fields depending on the command.

If the command is addressed to a particular device indicated in the Device ID field, then, in some embodiments, command decoding/forwarding logic 91 resident on that device will latch and execute the command, but need not forward the command to the next device in the stack. In some embodiments, the Device ID field is also used to indicate a broadcast command, for example '11111111'. In this case, the command will be executed by the logic 91 on each device. In some embodiments, after reset, each device is ready to receive a command, for example, a Broadcast Set Device ID command. An example of the Broadcast Set Device ID command is shown in Table 3.

TABLE 3

| Device ID | Command | Data |
| --- | --- | --- |
| 11111111 | 11111111 | 00000000 |

On receiving a Broadcast Set Device ID command (indicated in some embodiments by '11111111' within the Command field), the logic 91 within the device will load its internal device ID register to the value found within the Data field of the packet. For other types of command packets, the logic 91 would normally forward the command packet unaltered to the following device. However, for the Broadcast Set Device ID command, rather than forwarding the Broadcast Set Device ID command packet to the next device unaltered, logic 91 will increment the Data field before forwarding the command. If, for example, the external controller sends the command to the first device in the TSV stack with the value '00000000' in the Data field, then the first device in the stack will take this value for its Device ID, increment the value to '00000001', and send to the next device the resulting Broadcast Set Device ID command with the incremented value in the Data field. Each device in the stack processes the command in the same fashion, so each device obtains a unique device ID value.

In some embodiments, the serial packet based protocol requires as few as four TSVs to support a single bit data stream, as is seen from FIG. 9. These include an interrupted TSV for data input D and data output Q, an interrupted TSV for command strobe input CSI and command strobe output CSO, an uninterrupted TSV for clock Clk, and an uninterrupted TSV for reset R*.

On initialization, the controller would issue the Broadcast Set Device ID command to the bottom device in the stack and provide enough clock edges for the command to propagate through the maximum number of devices to be supported in a stack. FIG. 10 shows the timing of the Broadcast Set Device ID commands through the first three devices in the stack. The clock is not shown. Either SDR or DDR clocking may be employed. The data stream could be single bit wide in which case 8 clock edges would be required to transfer each byte in the packet, byte wide in which case a single clock edge would be required to transfer each byte, or any other practical width. The data in the three fields of the packet are shown in hexadecimal format. In the example shown, the packet is completely received before it is forwarded to the next device. In some embodiments, the receiving device begins transmitting the packet to the next device before it has completely received the packet from the previous device.

Figure 11:
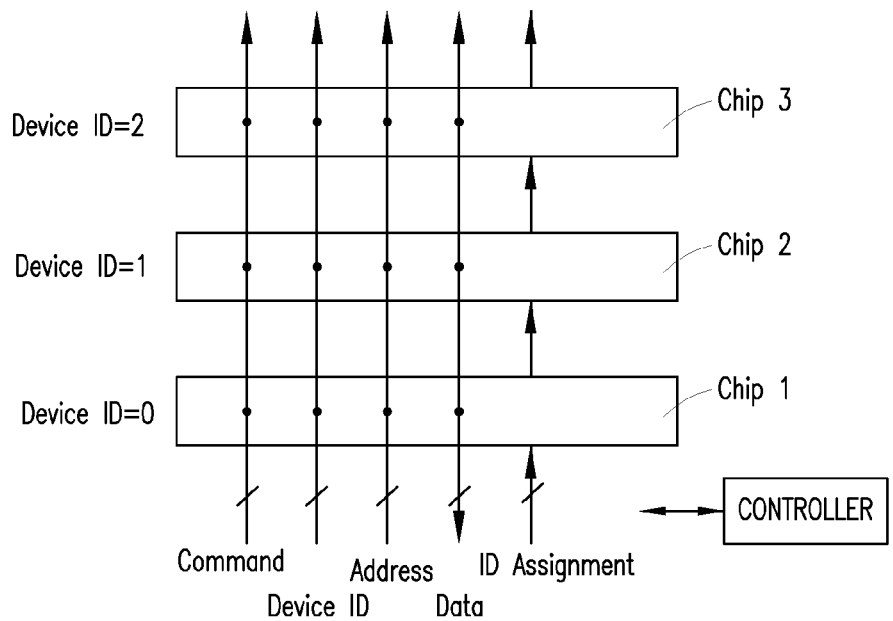
FIG. 11 diagrammatically illustrates a parallel bus architecture of uninterrupted TSVs for stacked IC access combined with interrupted TSVs that support stacked IC identification according to exemplary embodiments of the present work.

Following chip ID assignment, by any of the above-described approaches or another method, the controller in some embodiments determines how many devices are in the stack. In some embodiments, each chip is connected in parallel to unidirectional device ID, address, and command busses, and bidirectional data busses through uninterrupted TSV connections as shown in FIG. 11. The controller writes several locations in memory for each possible die in the stack, and then reads the locations to determine whether each die is actually present. Some embodiments use the command sequence of FIG. 12 for determining the number of memory devices present in a stack, using the parallel bus architecture of FIG. 11.

Figure 12:
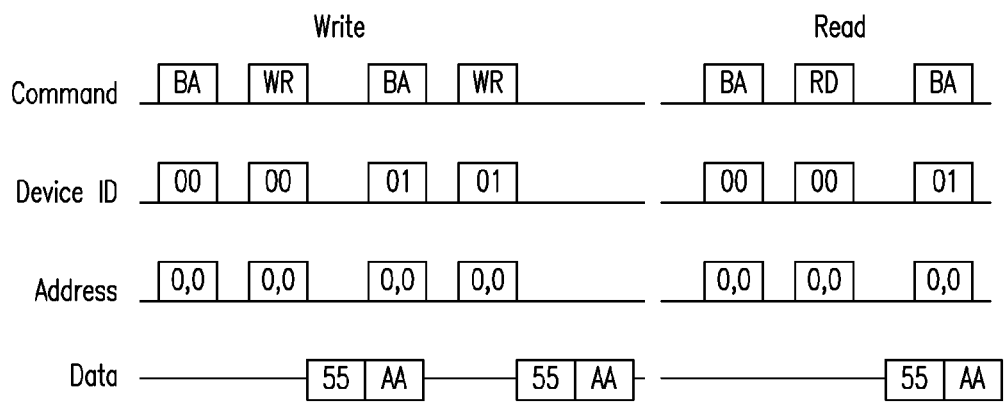
FIG. 12 is a timing diagram illustrating signaling that may be used with the parallel bus architecture of FIG. 11 to determine the number of ICs in a stack according to exemplary embodiments of the present work.

FIG. 12 shows a sequence of commands, addresses, and data for a synchronous DRAM such as SDRAM, DDR SDRAM, or LPDDR SDRAM. The clock is not shown. "Command" in FIG. 12 refers collectively to well known SDRAM control pins such as RAS*, CAS*, WE*, and CE*. The Device ID bus is an addition to the conventional DRAM interface to support operation of stacked devices with connection through TSVs. For illustrative purposes the Data bus is shown as an 8-bit bus although other data widths can be accommodated. Similar command sequences can apply to other forms of memory such as DDR2 SDRAM, DDR3 SDRAM, and NAND Flash memory.

The controller sends a sequence of commands beginning with a Bank Activate (BA) Command to the DRAM with Device ID=00 (the first device in the stack in this example) along with address bits specifying Bank Address 0 and Row Address 0 (abbreviated as 0,0 in the diagram). After a period of time allowing the bank activation process to complete, the controller sends a Write Command (WR) to device 0 along with address bits specifying Bank Address 0 and Column Address 0 (abbreviated as 0,0 in the diagram) followed by a 2 byte burst of data to be written "55" and "AA". The controller then continues to issue similar pairs of BA and WR commands to each possible Device ID up to the maximum number supported by the controller or the system. If a particular Device ID is not present in the stack, then the commands corresponding to that Device ID will be ignored.

After completing the write operations the controller then reads each possible device in the stack to determine which ones are actually present. The reading process begins with a Bank Activate (BA) Command to the DRAM with Device ID=00 (the first device in the stack in this example) along with address bits specifying Bank Address 0 and Row Address 0 (abbreviated as 0,0 in the diagram). After a period of time allowing the bank activation process to complete, the controller sends a Read Command (RD) to device 0 along with address bits specifying Bank Address 0 and Column Address 0 (abbreviated as 0,0 in the diagram). After a period of time device 0 provides the expected data "55" and "AA" on the data bus. The data bus is a tri-stated bus in some embodiments.

If there was no device with Device ID=0 the data bus would remain floating and the data read by the controller would be indeterminate. The data pattern "55" and "AA" is used because each bit in the byte changes in the transition from "55" to "AA". It is highly improbable that a floating data bus could mimic this pattern. A longer and more complex pattern could be used to further reduce the probability of noise mimicking the pattern. If the correct pattern is detected the controller knows the device is present. The controller then continues the read sequence up to the maximum number of device IDs supported by the controller or the system. If, for example, any one particular Device ID does not return the expected data, the controller determines that, assuming n devices are supported, there are n−1 devices in the stack. In some embodiments, the controller attempts to read data from devices associated with all possible device ID numbers, to account for faulty die. If devices higher than a device number that failed to return the expected data are found, the intervening device can be noted as defective so that it will not be used in normal operation.

If the wafer fabrication process allows an interrupted TSV, the location of TSVs on the die is not restricted. If the process does not allow breaking the connection between top TSV pad and bottom TSV pad, some embodiments employ an approach based on die rotation. For example a rectangular die will be stacked with alternating 180° rotation, although 90° rotation may also be possible especially for a square or nearly square die. Serial connections will have input TSVs with no top ball, while output TSVs have a top ball. A top pad is optional for an input TSV while the output TSV may or may not include a bottom pad and silicon through hole. The serial input TSV is located 180° opposite the serial output equidistant from the chip center of rotation, so that the ball on top of the serial output contacts the bottom pad of the serial input TSV of an upper die when the chips are stacked. The serial input TSV of a lower chip does not make any contact with the chip above. An example of the die layout for the TSV area of a DDR type SDRAM including two serial TSVs connected through die rotation is illustrated in FIG. 13. The TSV area is in the center of the chip, with banks of memory located on either side.

In the example architecture of FIG. 13, two series TSV connections S0 and S1 are provided. The outputs denoted by the suffix "o" have a top ball as indicated by the solid fill circle. The inputs denoted by the suffix "i" have no top ball as indicated by the outline circle. These two series TSV connections can support any of the above-described chip ID assignment techniques. Alternatively, additional series TSV connections could be provided to support higher numbers of chip IDs in the case of the staggered TSV approach (FIGS. 3 and 4) or the binary adder approach (FIG. 6). For the counter (FIGS. 7 and 8) or serial protocol (FIGS. 9 and 10) approaches, the required parallel distributed control signals such as clock and reset can be shared with the normal memory signals or provided by dedicated stacks of uninterrupted TSVs.

The remainder of the TSVs in FIG. 13 represent a synchronous DDR SDRAM type interface with 32 DQ pins and a DQS/DQS* pair per byte. Since the functionality of each DQ pin is interchangeable the alternating chip rotation poses no problem. DQ0 on one die is connected to DQ31 on the next die, but each die will access the same bit for both reads and writes. Likewise there are 2 bank address bits BA, 10 multiplexed row/column address bits RCA, and 8 row address only bits RA. Bits within these groups are also interchangeable. There are also a number of unique signals whose functions are not interchangeable including Reset (R*), CLK, CLK*, RAS*, CAS*, and WE*. These signals are duplicated in opposite vertical TSV connections. In some embodiments, the controller drives both vertical TSVs corresponding to the same function with identical signals. Each die receives the signal on one of the TSVs and can ignore the other. In some embodiments, the TSVs are shorted together on each die and the controller only drives a single signal. This approach increases the loading and may limit the number of chips that can be stacked for a given frequency of operation. In some embodiments, series connected TSVs are used for each of the aforementioned unique signals. This still requires two TSVs on each die. but the controller only drives a single signal. Loading is of course higher because of the two TSVs and the connection between them on each die.

Also included in the FIG. 13 architecture are four Device ID address bits designated as DIa-DId. With each command the controller provides a 4-bit Device ID supporting a stack of up to 16 devices in this example. Only the device with a Device ID (e.g., assigned by one of the techniques described above) that matches the bits DIa-DId will execute the command. The DI bits could have been duplicated in the same way as the DRAM control signals but this would have required a total of 8 TSVs. Instead, DI bit assignment is based on chip ID assignment. For even number chip ID, DIa, DIb, DIc, and DId inputs are assigned to internal on-chip signals DI0, DI1, DI2, and DI3, respectively. For odd number chip ID devices, representing chips rotated 180° with respect to the even number chip ID devices, the DIa, DIb, DIc, and DId inputs are assigned to DI3, DI2, DI1, and DI0, respectively. A simple multiplexer circuit controlled by the least significant bit of the on-chip Device ID register is used to provide the internal DI0, DI1, DI2, and DI3 signals based on the TSV inputs DIa, DIb, DIc, and DId. Since Device IDs must be assigned before any mission mode DRAM operations occur, this approach can save TSVs. Other DRAM pins such as RAS* and CAS* could also be paired and assigned based on Device ID. Only pins such as Reset (R*) and CLK/CLK*, which are used in Device ID assignment, need be duplicated or connected serially.

When a large number of stacked devices is to be supported, the loading on the parallel connected address, command, and data busses can limit the maximum operation frequency. In this case it is advantageous to use a serial point-to-point interface including suitable registered logic 141, as shown in FIG. 14. Since each device only has to drive the adjacent device, loading is significantly reduced allowing higher speed operation. A unidirectional output bus from the controller provides commands, addresses, and write data to the first device in the stack. This bus could be a single bit bus, a byte-wide bus or another width. A clock is provided by the controller. This could be a single ended clock or a differential clock. Clocking could be SDR or DDR. The clock may be center aligned with the command/address/Write data bus or it may be edge aligned. The clock can be regenerated in each device in the stack as shown or it could be bussed in parallel to some or all of the devices in the stack. A command strobe CS having functionality similar to the serial packet based chip ID assignment bus is also included. The controller also provides a reset signal which can be regenerated in each device in the stack as shown or bussed in parallel to some or all of the devices in the stack. Read data is returned to the controller on a unidirectional read data bus. A device providing read data on this downstream bus will also assert a downstream data strobe DS to delineate the read data burst so that lower devices will recognize the data and pass it on towards the controller. Typically each device adds a full clock cycle latency in both upstream and downstream paths. The controller will therefore expect each level of the stack to provide read data two full clock cycles later than the next lower level.

In the configuration shown in FIG. 14, the devices respond to a read command by driving read data on the downstream bus with a fixed latency from the read command. In some embodiments, the controller provides an upstream data strobe to the memory stack to indicate when read data is to be placed on the downstream read data bus. This allows read and write data transfers to be controlled independently and to occur simultaneously. On power up the controller can initialize device ID using the upstream Command/address/Write Data bus in the same way described above for serial packet based chip ID assignment. The controller can then issue write and read commands as described above for the architecture of FIG. 11. TABLE 4 shows a sequence of commands for writing and then reading a 2-byte pattern "55, AA" to/from locations in memory. For simplicity a single command is shown although for DRAM two steps may be required including first a bank activation command and then a write or a read command. Similarly for a NAND flash device a Page Read followed by a Burst Read command for reads or a Data Load followed by a Page Program for writes may be required. In TABLE 4, the simplified single read command is encoded as '00000000' and the simplified single write command is encoded as '00000001'.

TABLE 4

| Device ID | Command | Address1 | Address2 | Data1 | Data2 |
|---|---|---|---|---|---|
| 00000000 | 00000001 | 00000000 | 00000000 | 01010101 | 10101010 |
| 00000001 | 00000001 | 00000000 | 00000000 | 01010101 | 10101010 |
| 00000010 | 00000001 | 00000000 | 00000000 | 01010101 | 10101010 |
| ... | | | | | |
| 00001111 | 00000001 | 00000000 | 00000000 | 01010101 | 10101010 |
| 00000000 | 00000000 | 00000000 | 00000000 | | |
| 00000001 | 00000000 | 00000000 | 00000000 | | |
| 00000010 | 00000000 | 00000000 | 00000000 | | |
| ... | | | | | |
| 00001111 | 00000000 | 00000000 | 00000000 | | |

Following the sequence of operations in TABLE 4, the controller will determine how many devices are in the stack. Some embodiments prevent garbage from being returned to the controller when no device is being read. In some embodiments, the controller may write to a register in the last device in the stack to disable downstream inputs from a non-existent device higher in the stack. Only a device addressed with a read command will assert the data strobe DS. Lower devices can simply pass on received read data and strobe without any further gating.

In some embodiments, every device in the stack monitors read commands to determine which device will be placing data on the downstream read data path. Only devices lower in the stack will enable the downstream read data path inputs when read data from a higher device is expected. To accomplish this with the correct timing a device will have to determine from the Device ID in the command whether the addressed device is higher or lower in the stack. If it is lower, the path can be continuously disabled. If it is higher, the device subtracts its own Device ID from the Device ID in the command, and then multiplies the result by two to determine the additional latency (the number of additional clock cycles of delay between the received command and the actual read data) appearing at its own read data input. The total latency is determined by adding to the calculated additional latency the fixed latency from read command to read data or, if an upstream data strobe is provided, by adding to the calculated additional latency the fixed latency from upstream data strobe to read data. If each device in the stack and the controller performs this operation, the downstream data strobe DS is not required. Assuming the controller only sends commands to device IDs physically present in the stack, the upper device will only send read data downstream when it is addressed itself.

There is the potential that a faulty TSV connection could prevent the chip ID from being properly assigned. In general the number of TSVs dedicated to chip ID assignment will be low compared to the number of TSVs dedicated to address, data, and control. Many hundreds and possibly 1000's of TSVs are expected in some applications. Chip ID assignment may require as few as 3 TSVs. Therefore the relative cost of providing redundant chip ID assignment TSVs is not great, so general error correction codes such as Hamming codes are applied in some embodiments to solve the problem of faulty TSVs.

Figure 15:
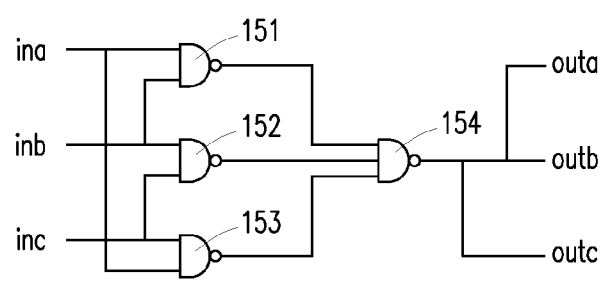
FIG. 15 diagrammatically illustrates a TSV redundancy scheme with voting logic for accommodating faulty TSVs according to exemplary embodiments of the present work.

FIG. 15 diagrammatically illustrates ⅔ voting logic according to example embodiments of the present work. Three separate TSV inputs, designated as ina, inb, and inc, provide three paths for the same digital data. In the absence of any errors all three TSV inputs will have the same logic level at any given time. If all three TSV inputs are logic 0, then NAND gates 151-153 all output logic 1, and NAND gate 154 outputs logic 0. If all three TSV inputs are logic 1, then NAND gates 151-153 all output logic 0, and NAND gate 154 outputs logic 1.

However, if any one of the TSV inputs is faulty (e.g., due to faulty TSV connection from the previous die), the ⅔ voting logic corrects the error. For example, a faulty TSV connection may cause one TSV input to be shorted to the substrate and held to Vss, i.e., a logic 0 level. With the other two TSV inputs at a logic 1 level, one of the NAND gates 151-153 will have logic 1 on both inputs, so its output will be logic 0. This provides a logic 0 input to NAND gate 154, causing it to output logic 1. On the other hand, if two of the TSV inputs are logic 0 and the third TSV input is faulty at logic 1, then NAND gates 151-153 will all output logic 1 to NAND gate 154, causing it to output logic 0.

The fault-corrected level output by NAND gate 154 may be used internally and also provided to three separate TSV outputs, designated as outa, outb, and outc, which are provided to the next die in the stack. Thus any signal connection, including a clock signal connection, may be immunized from a single faulty TSV. For wider data fields a more efficient Hamming error correction may be employed.

If, for example, each chip is connected in parallel to unidirectional device ID, address, and command busses, and bidirectional data busses through vertical TSV connections as shown in FIG. 11, the device ID must be error free. Some embodiments therefore apply voting logic or other hardware error correction to the device ID bus.

After assignment of Chip IDs through serial packet based chip ID assignment, the serial packet interface can be used to send other diagnostic commands. In particular it is desirable to test address and command busses to ensure that there are no faulty TSVs in these paths. Some embodiments provide additional serial commands, e.g., '10000001' and '10000010' as shown in the TABLE 5, to each device in the stack, instructing the devices to receive data on the address and command busses and output the data on the databus. Since the databus is typically much wider than the address and command busses, each address and command bit can be sent to multiple databus pins. If a data pattern identical to the pattern provided on an individual address or control bit appears on at least one databus bit, then that address or control bit input to the addressed chip is working. In the case of a synchronous interface this method can also be applied to the clock input. If the address or control bit input is shown to function properly for one or more databus bits, but one or more other databus bits associated with the address or control bit input do not output the pattern, then those databus bits are faulty. Commands '10000001' and '10000010' are persistent so they must be cleared with command '10000000' after the test is complete. Finally, each chip in the stack should be tested for write data input. This can be accomplished over the normal address, command, and data busses after verifying address and command input and data output in the preceding steps. Normal data writes followed by data reads can be performed. If there is a difference between data written and data read, it must be the result of a faulty data input buffer since the paths necessary for reading data have already been verified.

TABLE 5

| Command | Data | Description |
| --- | --- | --- |
| 10000000 | | Clear diagnostic commands |
| 10000001 | | Output command inputs on data pins |
| 10000010 | | Output address inputs on data pins |
| 10000100 | | Clear redundant registers |
| 10000101 | Bit# | Skip command bit |
| 10000110 | Bit# | Skip address bit |
| 10000111 | Bit# | Skip data bit |
| 11111111 | | Set Device ID |

Some embodiments provide redundant address, control, and data bus TSVs so that faulty TSVs can be disabled and replaced by redundant TSVs. This is controlled in some embodiments by commands sent over the serial packet interface of FIGS. 9 and 10. Some embodiments write the location of a defective bus bit to a repair index register, so the defective bit can be tagged to be bypassed. For example, with an N bit address bus, if address bit 4 is defective, a Skip Address Bit command '10000110" with data field "00000100" (see TABLE 5) would be issued. After this command is executed and the value is written to the repair index register, address inputs 0-3 will be provided by TSVs 0-3, TSV 4 will be bypassed, and address bits 4-(N−2) will be provided by TSV 5-(N−1), while address bit (N−1) will be provided by a spare TSV. Rather than providing a single spare TSV for an entire bus, various embodiments assign to each of a plurality of subsets of the bus one or more spare TSVs. All applicable Skip Address Bit commands are provided to all chips in the stack so that all chips will ultimately use an identical TSV configuration. In some embodiments, the controller and the chips in the stack leave all unused and faulty TSVs floating so that no power is wasted if the fault is due to a short circuit.

Some embodiments provide a semiconductor device including
   a) a substantially planar die having a top surface and a bottom surface;
   b) a plurality of metal interconnect layers separated by insulating layers disposed on the top surface of the die including a top metal layer and a bottom metal layer;
   c) a through silicon via (TSV) extending from the bottom surface of the die to a metal layer lower than the top metal layer and electrically contacting the metal layer lower than the top metal layer;
   d) a bottom metal pad disposed on the bottom surface of the die and electrically contacting the through silicon via; and
   e) a top metal pad formed above the through silicon via by a metal interconnect layer higher than the metal layer lower than the top metal layer.

In some embodiments, the top metal pad is formed by the top metal layer. In some embodiments, the metal layer lower than the top metal layer is the bottom metal layer. In some embodiments, a solder ball is attached to the top metal pad. In some embodiments, the bottom metal pad is connected to a circuit input. In some embodiments the top metal pad is connected to a circuit output. Some embodiments include one or more through silicon vias, top metal pads, and bottom metal pads substantially identical to the through silicon via, the top metal pad, and the bottom metal pad. Some embodiments include a direct vertical connection having a bottom metal pad disposed on the bottom surface of the die, a top metal pad formed by a metal interconnect layer higher than the metal layer lower than the top metal layer, and a through silicon via extending from the bottom metal pad to the top metal pad.

Some embodiments provide a plurality of semiconductor devices assembled in a stack, each device including;
   a) a substantially planar die having a top surface and a bottom surface;
   b) a plurality of metal interconnect layers separated by insulating layers disposed on the top surface of the die including a top metal layer and a bottom metal layer;
   c) a through silicon via (TSV) extending from the bottom surface of the die to a metal layer lower than the top metal layer and electrically contacting the metal layer lower than the top metal layer;
   d) a bottom metal pad disposed on the bottom surface of the die and electrically contacting the through silicon via; and
   e) a top metal pad formed above the through silicon via by a metal interconnect layer higher than the metal layer lower than the top metal layer;
   where adjacent devices in the stack are connected from the top metal pad of one device to the bottom metal pad of another device. In some embodiments, adjacent devices are connected by a solder ball. In some embodiments, the devices are identical.

Some embodiments provide a substantially planar semiconductor device including a plurality of through silicon vias (TSVs) each having a bottom pad, a top pad, and a through hole filled with conductive material electrically connecting the top pad and the bottom pad, where
   a) a first TSV and a second TSV are located equidistant from an axis of rotation perpendicular to the plane of the semiconductor device and separated by an angle of rotation;
   b) a third TSV and a fourth TSV are located equidistant from the axis of rotation and separated by the angle of rotation, the third TSV being electrically connected to the second TSV; and c) a fifth TSV and a sixth TSV are located equidistant from the axis of rotation and separated by the angle of rotation, the fifth TSV electrically connected to the fourth TSV;

where the semiconductor device further includes a chip ID circuit connected to the fourth TSV and the sixth TSV. In some embodiments, the angle of rotation is 180°. Some embodiments include a solder ball attached to the top pad of each of the first, second, third, and fifth TSVs.

Some embodiments provide three or more substantially planar semiconductor devices assembled in a stack, each device including a plurality of through silicon vias (TSVs) each having a bottom pad, a top pad, and a through hole filled with conductive material electrically connecting the top pad and the bottom pad, where each device includes;
- a) a first TSV and a second TSV are located equidistant and opposite an axis of rotation perpendicular to the plane of the semiconductor device;
- b) a third TSV and a fourth TSV are located equidistant and opposite the axis of rotation, the third TSV being electrically connected to the second TSV;
- c) a fifth TSV and a sixth TSV are located equidistant and opposite the axis of rotation, the fifth TSV electrically connected to the fourth TSV;

and where the devices are assembled in a stack in which;
- d) the bottom pads of first and second TSVs of a first device on the bottom of the stack are connected to a first logic level, and the bottom pads of fourth and sixth TSVs of the first device are connected to a second logic level opposite the first logic level;
- e) the bottom pads of first, second, fourth, and sixth TSVs of a second device rotated and placed on top of the first device are connected with solder balls to second, first, third and fifth top pads respectively of the first device; and
- f) the bottom pads of first, second, fourth, and sixth TSVs of a third device having the same orientation as the first device and placed on top of the second device are connected with solder balls to second, first, third and fifth top pads respectively of the second device.

Some embodiments provide a method of establishing device IDs in a stack of semiconductor devices including the steps of;
- a) providing logic levels to a first plurality of serial through silicon via (TSV) inputs on a first device in a stack;
- b) within the first device, receiving the logic levels on the first plurality of TSV inputs, scrambling the received logic levels, and providing the scrambled received logic levels to a first plurality of TSV outputs connected to a first plurality of serial TSV inputs on a second device in the stack;
- c) within the second device, receiving the logic levels on the first plurality of TSV inputs, scrambling the received logic levels, and providing the scrambled received logic levels to a first plurality of TSV outputs connected to a first plurality of serial TSV inputs on a third device in the stack;
- d) within the third device, receiving the logic levels on the first plurality of TSV inputs; and
- e) using the received logic levels in each of the first, second, and third devices to provide a device ID.

In some embodiments, the first, second, and third devices are identical. In some embodiments, the serial TSV outputs on each of the devices are located on the same axis perpendicular to the surface of the device as the corresponding TSV inputs. In some embodiments, the serial TSV outputs are located on an axis perpendicular to the surface of the device rotated 180° about the center of the device from an axis perpendicular to the surface of the device of the corresponding TSV inputs. In some embodiments, the scrambling includes connecting a logic level received on a first serial TSV input to a second serial TSV output and connecting a logic level received on a second serial TSV input to a third serial TSV output. In some embodiments, the serial TSV inputs are directly connected to serial TSV outputs within each device. In some embodiments, received logic levels in each of the first, second, and third devices are encoded to provide a device ID.

Some embodiments provide a method of establishing device IDs in a stack of semiconductor devices including the steps of;
- a) providing encoded logic levels to a first plurality of serial through silicon via (TSV) inputs on a first device in a stack;
- b) within the first device, receiving the encoded logic levels on the first plurality of serial TSV inputs, adding a fixed parameter to the encoded logic levels and providing the resulting logic levels to a first plurality of TSV outputs connected to a first plurality of serial TSV inputs on a second device in the stack;
- c) within the second device, receiving the encoded logic levels on the first plurality of serial TSV inputs, adding a fixed parameter to the encoded logic levels and providing the resulting logic levels to a first plurality of serial TSV outputs connected to a first plurality of serial TSV inputs on a third device in the stack;
- d) within the third device, receiving the logic levels on the first plurality of serial TSV inputs; and
- e) using the received logic levels in each of the first, second, and third devices to provide a device ID.

In some embodiments, the fixed parameter is 1. In some embodiments, the first, second, and third devices are identical. In some embodiments, the serial TSV inputs and serial TSV outputs are located on opposite sides of the devices on common axes perpendicular to the plane of the devices. In some embodiments, the serial TSV outputs are located on an axis perpendicular to the surface of the devices rotated 180° about the center of the devices from an axis perpendicular to the surface of the device of the corresponding TSV inputs.

Some embodiments provide a method of establishing a device ID within a semiconductor device including the steps of;
- a) resetting a counter;
- b) asserting a counter enable signal to a next device;
- c) receiving a counter enable signal from a previous device;
- d) incrementing the counter on edges of a clock signal while the counter enable signal from a previous device is asserted;
- e) de-asserting the counter enable signal to a next device following an edge of the clock signal that occurs when the counter enable signal from a previous device is de-asserted;
- f) providing a counter output as the device ID.

In some embodiments, the edges of the clock are rising edges of the clock. In some embodiments, the counter enable signal to a next device is provided by a flip-flop.

Some embodiments provide a semiconductor memory device configured for interconnection within a stack of devices including;
- a) a plurality of pairs of databus terminals, each pair having a first terminal on a first surface of the device and a second terminal on a second surface of the device opposite the first surface, the first and second terminals electrically connected by a through silicon via (TSV);

b) a plurality of pairs of control terminals, each pair having a first terminal on the first surface of the device and a second terminal on the second surface of the device, the first and second terminals electrically connected by a through silicon via (TSV);

c) a plurality of pairs of serial terminals, each pair having a first terminal on the first surface of the device and a second terminal on the second surface of the device, the first terminal electrically connected to a through silicon vias (TSVs);

d) a plurality of data output buffers electrically connected to the databus terminals;

e) a plurality of data input buffers electrically connected to the databus terminals;

f) a control circuit electrically connected to the control terminals g) a device ID circuit having inputs electrically connected to a selected terminal of each pair of serial terminals, and outputs electrically connected to a terminal other than the selected terminal of each pair of serial terminals.

In some embodiments, the first terminal and the second terminal of each pair of serial terminals and are located on a common axis substantially perpendicular to the first surface and the second surface. In some embodiments, the first terminal of each pair of serial terminals is located on an axis rotated 180° about an axis perpendicular to the first surface and the second surface of the devices through the center of the device from an axis perpendicular to the first surface and the second surface of the devices passing through the second terminal of each pair of serial terminals. In some embodiments, the device ID circuit comprises an adder. In some embodiments, the device ID circuit comprises a counter. In some embodiments, the device ID circuit comprises a serial command packet decoder. In some embodiments, the inputs of the device ID circuit are electrically connected to the first terminal of the plurality of pairs of serial terminals.

Some embodiments provide a semiconductor memory device configured for interconnection within a stack of devices including;

a) a plurality of pairs of upstream serial terminals, each pair having a first terminal on the first surface of the device and a second terminal on the second surface of the device, the first terminal electrically connected to a through silicon via (TSV);

b) a plurality of pairs of downstream serial terminals, each pair having a first terminal on the first surface of the device and a second terminal on the second surface of the device, the first terminal electrically connected to a through silicon via (TSV);

c) a plurality of command input buffers electrically connected to a selected terminal of each pair of upstream serial terminals and a plurality of command output buffers electrically connected to a terminal other than the selected terminal of each pair of upstream serial terminals;

d) a plurality of data input buffers electrically connected to a selected terminal of each pair of downstream serial terminals and a plurality of data output buffers electrically connected to a terminal other than the selected terminal of each pair of downstream serial terminals;

e) a control circuit electrically connected to the plurality of command input buffers;

f) a device ID circuit electrically connected to the plurality of command input buffers;

g) a data input buffer disable circuit connected the plurality of data input buffers.

In some embodiments, the first terminal and the second terminal of each pair of upstream and downstream serial terminals and are located on a common axis substantially perpendicular to the first surface and the second surface. In some embodiments, the first terminal of each pair of upstream and downstream serial terminals is located on an axis rotated 180° about an axis perpendicular to the first surface and the second surface of the devices through the center of the device from an axis perpendicular to the first surface and the second surface of the devices passing through the second terminal of each pair of upstream and downstream serial terminals. In some embodiments, the data input buffer disable circuit comprises a register that is set to indicate the last memory device in a stack of memory devices and disable the plurality of data input buffers. In some embodiments, the data input buffer disable circuit compares a target device address within a command received by the control circuit with a device ID provided by the device ID circuit to selectively disable the plurality of data input buffers. In some embodiments, the plurality of data input buffers are disabled when the target device address is upstream of the device.

Some embodiments provide a method of selecting a semiconductor device in a stack of semiconductor devices including the steps of:

a) providing logic levels to a first plurality of serial through silicon via (TSV) inputs on a first device in a stack;

b) within the first device, receiving the logic levels on the first plurality of TSV inputs, scrambling the received logic levels, and providing the scrambled received logic levels to a first plurality of TSV outputs connected to a first plurality of serial TSV inputs on a second device in the stack;

c) within the second device, receiving the logic levels on the first plurality of TSV inputs, scrambling the received logic levels, and providing the scrambled received logic levels to a first plurality of TSV outputs connected to a first plurality of serial TSV inputs on a third device in the stack;

d) within the third device, receiving the logic levels on the first plurality of TSV inputs; and e) using the received logic levels in each of the first, second, and third devices to select one of the first, second, or third devices.

In some embodiments, the first, second, and third devices are identical. In some embodiments, the serial TSV outputs on each of the devices are located on the same axis perpendicular to the surface of the device as the corresponding TSV inputs. In some embodiments, the serial TSV outputs are located on an axis perpendicular to the surface of the device rotated 180° about the center of the device from an axis perpendicular to the surface of device of the corresponding TSV inputs. In some embodiments, the scrambling includes connecting a logic level received on a first serial TSV input to a second serial TSV output and connecting a logic level received on a second serial TSV input to a third serial TSV output. In some embodiments, the scrambling includes connecting a logic level received on a first serial TSV input to a second serial TSV output and connecting a logic level received on a second serial TSV input to a third serial TSV output, the first serial TSV input of the first device receives a first logic level and the second serial TSV input of the first device receives a second logic level opposite the first logic level. In some embodiments, the scrambling includes connecting a logic level received on a first serial TSV input to a second serial TSV output and connecting a logic level received on a second serial TSV input to a third serial TSV output, the first serial TSV input of the first device receives a first logic level, the second serial TSV input of the first device receives a second logic level opposite the first logic level, and the received logic levels in each of the first, second, and third devices are scrambled to form a thermometer code. In some embodiments, the serial TSV inputs are directly connected to serial TSV outputs within each device. In some embodiments, received logic levels in each of the first, second, and third devices represent the position of the device in a stack of devices. In some embodiments, received logic levels in each of the first, second, and third devices represent the position of the device in a stack of devices, and are encoded to provide a device ID. In some embodiments, received logic levels in each of the first, second, and third devices represent the position of the device in a stack of devices, a command including a device address is provided, and the device address is compared to the logic levels within each of the first, second, and third devices to determine which device should execute the command. In some embodiments, received logic levels in each of the first, second, and third devices represent the position of the device in a stack of devices, a command including a device address is provided, and the device address is compared to the logic levels within each of the first, second, and third devices to determine which device should execute the command, and only a single device executes the command.

Although example embodiments of the invention have been described above in detail, this does not limit the scope of the invention, which can be practiced in a variety of embodiments.

What is claimed is:

1. An integrated circuit apparatus, comprising:
a substrate;
an active circuit and interconnect layer provided on said substrate and including a plurality of constituent metal layers;
a plurality of vias extending through said substrate from said active circuit and interconnect layer to a surface of said substrate opposite said active circuit and interconnect layer;
a plurality of bond pads provided on said surface, said bond pads respectively axially aligned with and electrically connected to said vias; and
a plurality of terminals provided on said active circuit and interconnect layer, said terminals respectively axially aligned with said vias, a first subset of said terminals electrically connected to the associated vias, and a second subset of said terminals including one said terminal provided as an electrically distinct node relative to the associated axially aligned via,
wherein said one terminal is an output of circuitry in said active circuit and interconnect layer, and the associated axially aligned via is an input of said circuitry.

2. The integrated circuit apparatus of claim 1, wherein said circuitry is a digital latching circuit.

3. The integrated circuit apparatus of claim 1, wherein said second subset includes a plurality of said terminals provided as respective outputs of said circuitry, and wherein the respectively associated axially aligned vias are respective inputs of said circuitry.

4. The integrated circuit apparatus of claim 3, wherein said inputs carry signals that identify said integrated circuit apparatus.

5. The integrated circuit apparatus of claim 4, wherein said circuitry is a digital adder circuit.

6. The integrated circuit apparatus of claim 1, wherein said second subset includes a plurality of said terminals connected through said active circuit and interconnect layer to respective ones of said vias that are axially offset from the respective terminals.

7. The integrated circuit apparatus of claim 6, wherein said first subset includes one of said terminals connected through said active circuit and interconnect layer to one of said vias that is axially offset from said one terminal.

8. The integrated circuit apparatus of claim 7, wherein said terminals of said second subset and said terminal of said first subset carry signals that identify said integrated circuit apparatus.

9. The integrated circuit apparatus of claim 6, including a plurality of further vias that connect said terminals of said second subset to the associated axially offset vias.

10. The integrated circuit apparatus of claim 1, wherein each said terminal includes a solder ball.

11. The integrated circuit apparatus of claim 10, wherein each said terminal includes a bond pad interposed between said solder ball and said active circuit and interconnect layer.

12. The integrated circuit apparatus of claim 3, wherein said inputs carry signals that identify said integrated circuit apparatus, and also carry signals associated with functionality of said integrated circuit apparatus.

13. An integrated circuit apparatus, comprising:
a plurality of integrated circuits according to claim 1, the plurality of integrated circuits being arranged to form a stack of integrated circuits
wherein said terminals of one of said integrated circuits are respectively electrically connected to said bond pads of another of said integrated circuits that is adjacent said one integrated circuit in said stack.

14. The integrated circuit apparatus of claim 13, wherein said active circuit and interconnect layers are configured to implement collectively a digital data storage apparatus.

15. The apparatus of claim 13, wherein said one integrated circuit is identical to said another integrated circuit, and wherein said vias of said one integrated circuit are axially offset from the identically corresponding vias of said another integrated circuit.

16. The apparatus of claim 15, wherein said one integrated circuit is interposed in said stack between said another integrated circuit and a further said integrated circuit that is also identical to said one integrated circuit and has said terminals thereof respectively connected to said bond pads of said one integrated circuit, wherein said vias of said one integrated circuit are axially offset from the identically corresponding vias of said further integrated circuit, and wherein said vias of said further integrated circuit are axially aligned with the identically corresponding vias of said another integrated circuit.

17. An electronic system, comprising:
a plurality of integrated circuits according to claim 1, the plurality of integrated circuits being arranged to form a stack of integrated circuits
wherein said terminals of one of said integrated circuits are respectively electrically connected to said bond pads of another of said integrated circuits that is adjacent said one integrated circuit in said stack; and
electronic circuitry coupled to said bond pads of said one integrated circuit to permit signaling between said electronic circuitry and said stack of integrated circuits.

18. The system of claim 17, wherein said active circuit and interconnect layers are configured to implement collectively a digital data storage apparatus, and wherein said electronic circuitry includes a controller for accessing said digital data storage apparatus.

* * * * *